United States Patent [19]

Gagnon et al.

[11] Patent Number: 5,785,789
[45] Date of Patent: Jul. 28, 1998

[54] LOW DIELECTRIC CONSTANT MICROSPHERE FILLED LAYERS FOR MULTILAYER ELECTRICAL STRUCTURES

[75] Inventors: Gerald Gagnon, Nashua, N.H.; Richard Alwyn Barnett, Methuen, Mass.; James Anthony Apruzzi, Nashua, N.H.

[73] Assignee: Digital Equipment Corporation, Maynard, Mass.

[21] Appl. No.: 344,793

[22] Filed: Nov. 23, 1994

Related U.S. Application Data

[63] Continuation of Ser. No. 032,922, Mar. 18, 1993, abandoned.

[51] Int. Cl.$^6$ ................................................. B32B 31/00
[52] U.S. Cl. ........................... 156/235; 156/230; 156/246; 156/307.1
[58] Field of Search .................... 156/230, 233, 156/235, 237, 239, 247, 249, 246, 307.1; 264/61; 427/96, 199, 204; 428/313.9, 313.3, 901

[56] References Cited

U.S. PATENT DOCUMENTS

| | | | |
|---|---|---|---|
| 2,390,025 | 11/1945 | Oeyrup | 156/239 X |
| 2,747,977 | 5/1956 | Eisler | 156/233 X |
| 2,892,972 | 6/1959 | Ross | 156/233 X |
| 2,984,597 | 5/1961 | Hennei | 156/233 X |
| 3,334,002 | 8/1967 | Meywang | 156/239 X |
| 3,374,515 | 3/1968 | Girard | 156/233 X |
| 3,410,744 | 11/1968 | Böld | 156/233 |
| 3,514,326 | 5/1970 | Stow | 428/343 X |
| 3,990,296 | 11/1976 | Konicek | 156/233 X |
| 4,098,945 | 7/1978 | Oehmke | 428/343 X |
| 4,180,608 | 12/1979 | Del | 156/249 X |
| 4,403,107 | 9/1983 | Hoffman | 427/276 X |
| 4,455,181 | 6/1984 | Lifshin | 156/233 X |
| 4,661,301 | 4/1987 | Okada et al. | 264/41 |
| 4,680,220 | 7/1987 | Johnson | 428/241 |
| 4,722,765 | 2/1988 | Ambros | 156/233 X |
| 4,821,142 | 4/1989 | Ushifusa | 361/395 X |
| 4,853,277 | 8/1989 | Chant | 156/235 X |
| 4,859,512 | 8/1989 | Jones | 156/230 X |
| 4,867,935 | 9/1989 | Morrison | 264/61 |
| 4,869,767 | 9/1989 | Robinson | 156/241 X |
| 4,897,136 | 1/1990 | Bailey | 156/241 X |
| 4,940,623 | 7/1990 | Bosna | 427/275 X |
| 4,994,302 | 2/1991 | Kellerman | 427/96 X |
| 5,049,221 | 9/1991 | Wada | 156/239 X |
| 5,049,434 | 9/1991 | Wasucko | 156/230 X |
| 5,098,781 | 3/1992 | Minnick | 428/313.5 |
| 5,126,192 | 6/1992 | Chellis et al. | 428/323 |
| 5,154,954 | 10/1992 | Croop | 428/34.5 X |
| 5,183,972 | 2/1993 | Duane et al. | |
| 5,312,691 | 5/1994 | Even et al. | 428/458 |
| 5,348,990 | 9/1994 | Walpita et al. | 428/421 X |

FOREIGN PATENT DOCUMENTS

| | | | |
|---|---|---|---|
| 0440918 | 8/1991 | European Pat. Off. | |
| 404339647 | 11/1992 | Japan | 156/233 |

OTHER PUBLICATIONS

"Low Dielectric Constant Material For Printed Circuit Boards" F. W. Haining and D. G. Herbaugh, 1979 IBM Technical Disclosure Bulletin, p. 1799.

*Primary Examiner*—Curtis Mayes
*Attorney, Agent, or Firm*—Michael A. Rodriguez; Ronald C. Hudgens

[57] ABSTRACT

Disclosed are multilayer electrical structures comprising a discrete, partially-cured, microsphere-filled resin layer, and a method for fabricating such multilayer electrical structures using a carrier member to support and introduce the microsphere-filled resin layer.

12 Claims, 4 Drawing Sheets

LOW DIELECTRIC CONSTANT MICROSPHERE FILLED LAYERS FOR MULTILAYER ELECTRICAL STRUCTURES

This application is a continuation of application Ser. No. 08/032,922, filed Mar. 18, 1993 now abandoned.

The present invention is directed to the fabrication of multilayer electrical structures. It particularly concerns the method of fabrication of microsphere-filled dielectric layers and the multilayer structures produced thereby.

BACKGROUND OF THE INVENTION

Multilayer electrical core material, for use in applications such as printed circuit boards, typically comprises layers of resin-impregnated woven glass reinforcement (prepreg) sandwiched between conductive layers of copper foil. However, the continued development of higher speed computing systems has required electrical and thermal properties which extend beyond the performance limits of the current standard materials. These higher speed applications involve extremely dense circuitry which must be patterned on low dielectric constant insulating material. The dielectric constant (Er) values of conventional FR4 epoxy resin and common woven glass fiber laminate prepregs are generally on the order of about four to six respectively. For example, a commonly used multilayer style prepreg, a resin/glass fabric laminate, typically contains about forty percent by weight of glass fabric and about sixty percent by weight of an epoxy resin material. Such laminate prepregs feature a dielectric constant of approximately 4.6. This relatively high dielectric constant results in less rapid propagation of signals in adjacent circuit lines and attendant excessive signal delay time. Since progressively higher speed computers demand faster system cycle times, any delay time attributed to signal travel within the printed circuit board becomes increasingly significant. Accordingly, lower Er laminate products are needed. Anticipated Er requirement levels of 2.8, or lower, dictate that new materials and/or structures be developed.

It has been recognized that one effective technique for lowering the dielectric constant of electrical multilayer material is by the incorporation of hollow glass microspheres (HGS) into the prepreg layer. The practical manner of introducing the microspheres is to include them with the resin used to prepare the reinforcement prepreg. A 1979 IBM Technical Disclosure Bulletin by F. W. Haining and D. G. Herbaugh entitled "Low Dielectric Constant Material For Printed Circuit Boards" discloses the use of hollow glass microspheres as fillers in an epoxy laminating resin that is applied to the surface of a conventional glass cloth. Another IBM publication, European Patent Application 0440918A2, shows a printed circuit board including a hollow microsphere-filled, glass fabric reinforced, polymer resin composite material.

The effective Er of such composite electrical laminate materials usually can be estimated simply by calculating a weighted average of the Er of each individual component and its volume fraction contained in the laminate composite. With an Er of woven glass fabric of about 6.1 and an Er of typical raw resin of about 3.8, a conventional epoxy resin/glass fabric prepreg composite features an Er of about 4.6. Incorporating glass microspheres into the composite theoretically can be utilized to reduce the overall Er values, the reduction in Er being attributed to the volume of air (Er=1) contained within the microspheres.

However, with the conventional prepreg laminate fabrication techniques that are now practiced, microsphere filled formulations are limited to incorporation at practical levels no greater than about 10% by weight. This level is dictated by the ability of the irregular surface of glass fabric to take up the microsphere-filled resin as it is processed into a prepreg. The impregnation of a roll of glass cloth material is accomplished by passing the cloth through a tank of the resin/microsphere mixture and then drying and partially curing the resin with heat. In addition to limiting the incorporation level of the glass microspheres, the scheme of introducing the microspheres to the electrical laminate structure simply by adding the microspheres to the resin bath composition in the standard glass fabric prepreg processing technique also limits the effectiveness of the microsphere introduction in reducing the overall Er of the laminate core composite. As discussed above, although the glass fabric is the higher Er component of the prepreg (Er about 6.1), introducing the microspheres in the standard glass fabric reinforcement prepreg processing technique results in displacement of a portion of the lower Er resin component (Er about 3.8) rather than replacement of the fabric component. Where it is desirable to build up the thickness of the dielectric layer(s), or where multiple cores are laminated, for example, to form a printed wiring board (PWB) structure, multiple layers of glass fabric prepreg must be introduced, compounding the Er problem. Unless alternative low Er reinforcement material is developed to replace the standard glass fabric, it remains a practical impossibility to achieve the low Er requirement levels demanded by industry developments. Unfortunately, currently proposed or available alternative reinforcement materials generally are costly, prohibitively expensive to use in PWB manufacture, and/or introduce undesirable physical properties.

SUMMARY OF INVENTION

A method now has been discovered whereby glass microspheres can most effectively be used to lower the Er of multilayer electrical structures. According to the presently invented method, a mixture of the glass microspheres and a resin first is coated on a removable carrier member. The coating on the carrier then is partially cured and the carrier member then is used to introduce the discrete microsphere-filled resin layer into the multilayer fabrication process. Since the partially cured, microsphere-filled resin layer is introduced to the multilayer structure as a discrete component, in specific, separate from the glass fabric or glass fabric prepreg reinforcement layer, single or multiple discrete microsphere/resin layers can be used to build up dielectric layer thickness and/or bond multiple laminate cores together, without, for example, having to introduce another glass fabric layer each time a microsphere/resin layer is used. In this manner, unique multilayer structures can be accomplished wherein microsphere content can be maximized (to lower Er), while being able to reduce the amount of glass fabric (high Er) reinforcement, or other alternative reinforcement material, to that required for manufacturability and/or structural integrity.

The microspheres used in the present invention can be any of the variety of electronic grade hollow glass microspheres commercially available. Such microspheres may or may not feature etched surface areas and/or include adhesion promoting surface coatings. Suitable microspheres include the borosilicate glass microspheres available from 3M under the "Scotchlite" designation (e.g., Scotchlite "H-5010000", "S-6010000", "G" type, and "D-324500") and from Emerson & Cuming/Grace Syntactics Inc. under the designation "Eccospheres" (e.g. Eccospheres "SI" "SDT" and "FTD202"). Such microspheres typically feature a diameter ranging from about 2 to 150 microns and with a wall thickness ranging from about 0.5 to about 3 microns. The presently preferred hollow glass microspheres are the 3M "Scotchlite S-6010000" microspheres. The manufacturer describes this material as comprising hollow glass microspheres having an average size of about 2 to 70 microns, and having an average wall thickness of 0.5 to 3 microns.

The resin component used in the present invention can be any resinous composition compatible with electrical laminate fabrication. Various resin systems have been proposed in the art. These include epoxies, cyanate esters, bismaleimide triazines (BTs), polyimides, polyamides, polyesters, phenolics, acrylic resins, and combinations and blends thereof. A preferred resin system is a polyphenylene oxide/epoxy resin system available from General Electric Company under the trademark "Getek". A more thorough description of this resin system is included in U.S. Pat. No. 5,098,781 issued to Minnick, et al.

The microspheres can be mixed with the selected resin system in any desired proportion using any conventional blending technique. Preferably, the microspheres are incorporated into the resin in a proportion ranging from about 10 to about 50 percent by weight, most preferably about 15 to about 20 percent. It is preferred that the blending of the microspheres into the resin system be accomplished by a low shear mixing technique in order to minimize rupture of the hollow glass microsphere component. As the difference in density between the microspheres and resin tends to cause separation of the microsphere content, it may be desirable to process the blend promptly, or include a thixotropic agent, such as fumed silica, to retard microsphere segregation.

The microsphere-filled resin blend can be applied to the carrier member using any conventional coating technique. For example, a suitable layer of laminate material can be accomplished by curtain coating, doctor blade, spin coating, or roller coating a mixture of resin and microspheres onto the carrier surface. Precisely controlled layer thicknesses ranging from about 0.0005" to about 0.0120" are preferred. After application to the carrier, the microsphere-filled resin layer then is partially cured by heating the coated carrier using conventional techniques. Curing conditions are a function of the particular resin system and catalyst that are used. Typical curing conditions for a HGS/"Getek" type resin layer, having a thickness of about 0.003" to about 0.005", include a two-stage heating cycle, the first stage featuring a temperature of about 120° C. for a period of about 3–4 minutes, and a second stage having a temperature of about 160° C. for about 3–4 minutes.

The carrier member is any sheet material which offers a surface with sufficient adhesion to support a discrete layer of the microsphere-filled resin layer. Preferably, the carrier member can be removed from the microsphere-filled resin layer during the fabrication of the multilayer electrical structure. The carrier can be any organic or inorganic supporting layer that is not adversely affected by processing temperatures. Suitable carriers include such materials as metal sheet such as metal foil, and metal laminates (e.g. Cu/Mo/Cu, or Cu/Ni—Fe ("Invar")/Cu), plastic sheet such as polyethylene, polyetherimide (e.g., "Ultem"), and polyester (e.g., "Mylar"), release-treated paper sheets, and ceramic. Preferably, the carrier is removable by standard techniques such as peeling or etching. A preferred peelable carrier is release-treated paper sheet material; a preferred etchable carrier is copper foil.

As mentioned above, the invention can be practiced with a carrier member which, though removable, can become incorporated into the multilayer structure, rather than being removed from the microsphere-filled resin layer prior to lamination. For example, a preferred practice of this alternative embodiment is to apply the microsphere-filled resin blend to one or both sides of a sheet of an etchable metallic foil, such as copper or aluminum foil, that, in turn, is used to form the outer layer(s) of an electrical laminate core wherein the microsphere-filled resin layer(s) and, if required, a reinforcement layer, are sandwiched between two sheets of the metallic foil.

The microsphere-filled resin layer can be used as the sole dielectric layer(s) or can be used in conjunction with additional dielectric or reinforcement layers. Such additional layers may be desirable for purposes of manufacturability or structural integrity. The additional layer(s) can be any of the materials conventionally used for this purpose. Typical materials include standard woven or non-woven sheet material, such as glass or aramid fiber ("Kevlar"), polyetherimide sheet ("Ultem"), quartz, liquid crystal, or ceramic.

BRIEF DESCRIPTION OF THE DRAWINGS

For a further understanding of the nature and objects of the present invention, reference should be made to the following detailed description taken in connection with the accompanying figures wherein.

DETAILED DESCRIPTION OF THE PREFERRED EMBODIMENTS

Figure 1:
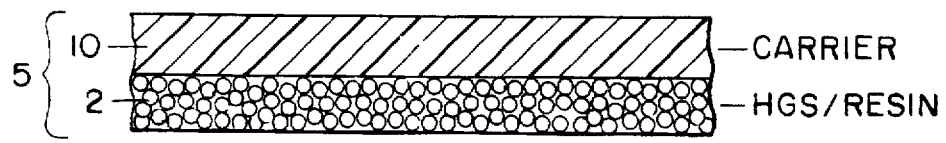
FIG. 1 is a simplified, magnified sectional view of a supported microsphere-filled resin laminate layer according to the present invention.
Figure 2:
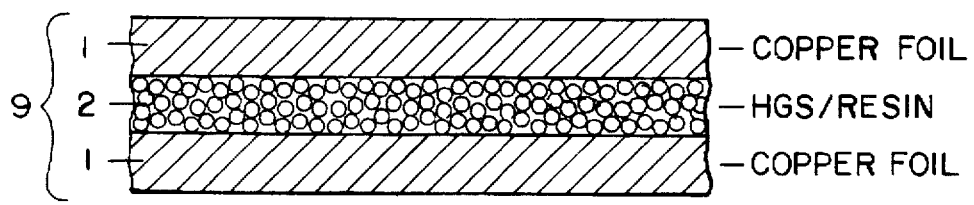
FIGS. 2–5 are simplified, magnified sectional views of multilayer electrical laminate core structures according to the present invention.

A basic embodiment of the invention is a laminar structure as illustrated in FIG. 1. The structure 5 comprises a carrier member 10 supporting a partially-cured, microsphere-filled resin layer 2, to which it is peelably bonded. The partially-cured ("B-stage") structure 5 then can be utilized in the fabrication of various multilayer electrical structures, such as those depicted in FIGS. 2–6.

Figure 3:
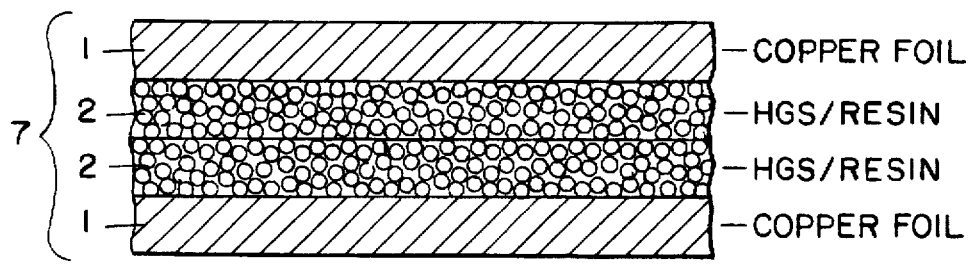

FIGS. 2–5 illustrate unique multilayer electrical core structures 6, 7, and 8 which can be accomplished pursuant to the present invention. The core structure 9 in FIG. 2 includes two conductive layers of copper foil 1 which sandwich an inner structure of a microsphere-filled resin layer 2. To build up dielectric thickness or to increase structural integrity, multiple microsphere-filled resin layers 2 may be used in the internal core structure, as is illustrated in FIG. 3, wherein two microsphere-filled resin layers 2 are sandwiched between two copper foil layers 1 to form core structure 7.

Figure 4:
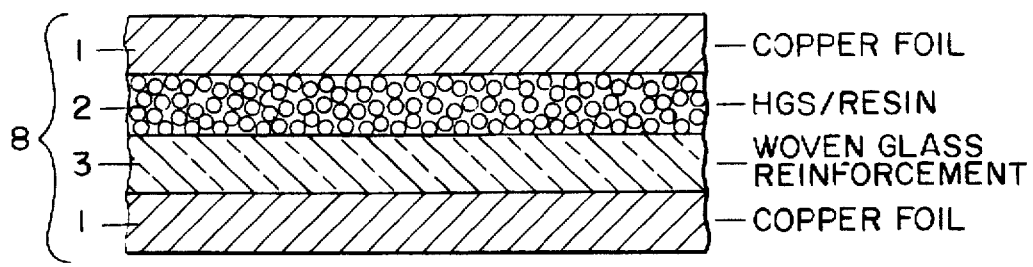

In FIG. 4, a core structure 8 features a microsphere-filled resin layer 2, used in combination with a conventional woven glass reinforcement sheet 3, which in turn is sandwiched between sheets of copper foil 1 to form core structure 8.

Figure 5:
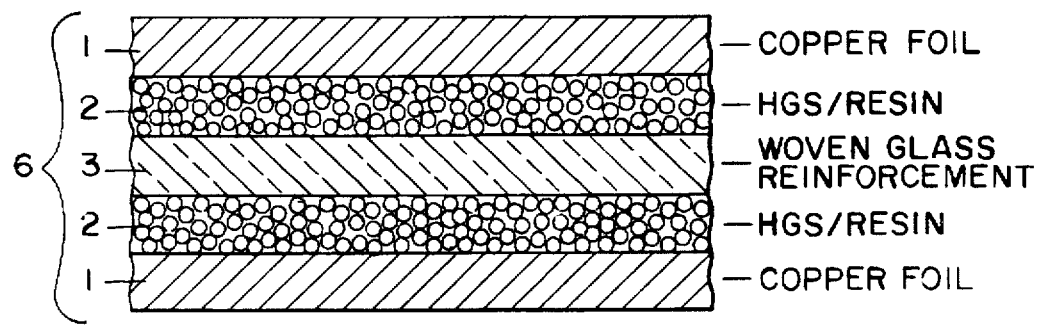

Another alternative multilayer core structure 6 is shown in FIG. 5. In this embodiment, two microsphere-filled resin layers 2, in combination with a central woven glass reinforcement sheet 3, are sandwiched between copper foil sheets 1.

Figure 6:
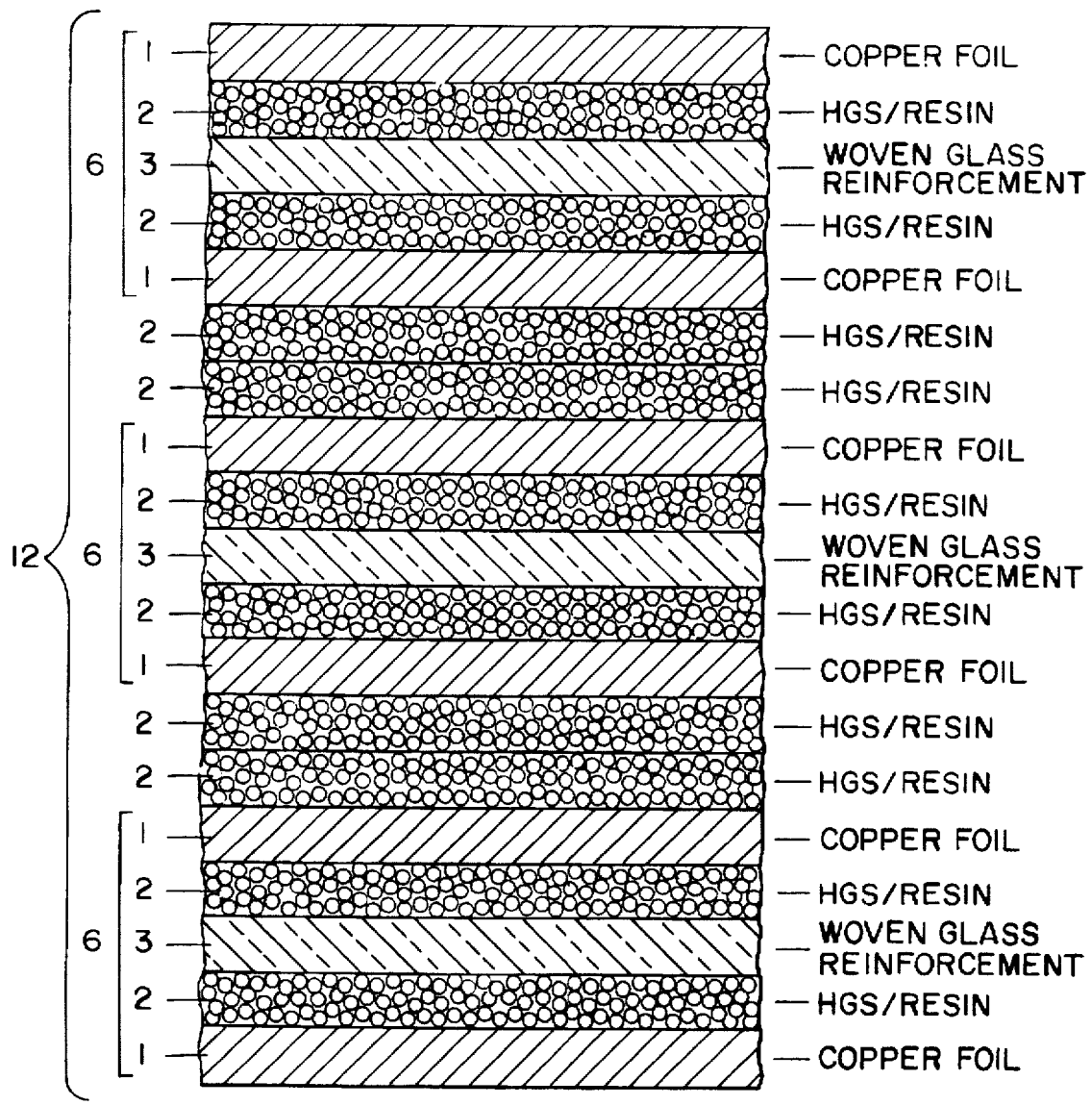
FIG. 6 is a simplified figure of a side view of a complete printed wiring board multilayer electrical structure according to the present invention.

In FIG. 6, a multilayer electrical printed wiring board structure 12 is illustrated. The PWB is fabricated by laminating several multilayer electrical core structures 6, as previously shown in FIG. 5, with bonding interlayers of microsphere-filled resin layers 2. The individual core structures 6 are made up of two microsphere-filled resin layers 2, in combination with a central woven glass reinforcement sheet 3, sandwiched between copper foil sheets 1.

Figure 7:
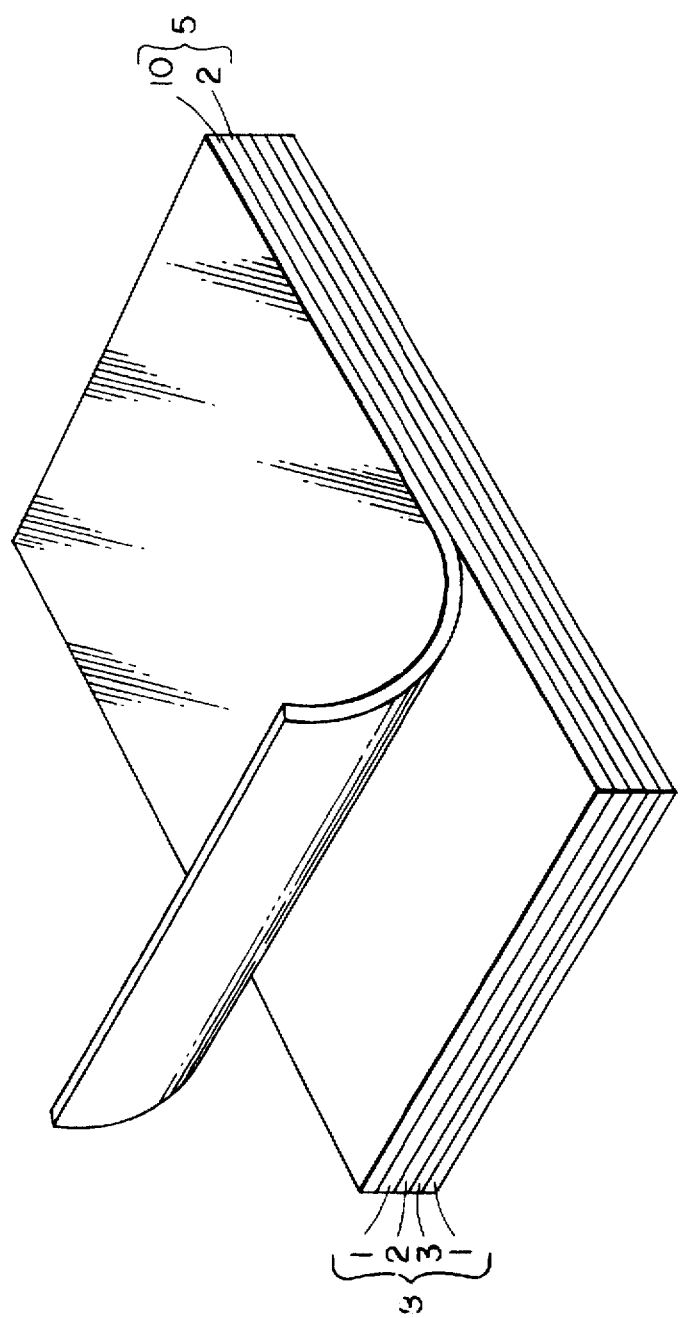
FIG. 7 is a perspective view of a multilayer electrical structure including a removable carrier member, according to one embodiment of the invention.

FIG. 7 serves to illustrate one embodiment of fabricating a multilayer electrical structure according to the present invention. A multilayer electrical core structure 8 (as previously described in FIG. 4) includes a microsphere-filled resin layer 2, used in combination with a woven glass reinforcement sheet 3, sandwiched between sheets of copper foil 1. In fabricating a multilayer electrical structure, such as shown in FIG. 7, a discrete, partially-cured, microsphere-filled resin layer 2 is introduced to the outer surface (copper foil layer 1) of multilayer core structure 8 by using a removable carrier member 10 to support the microsphere-filled resin layer 2 (multilayer, B-stage structure 5, as shown in FIG. 1) during application. Plastic carrier member 10 then can be peeled away from the multilayer structure, which then features a B-stage surface ready for bonding to an additional layer or multilayer structure.

The following examples are provided to further describe the invention. The examples are intended to be illustrative and are not to be construed as limiting the scope of the invention. All parts and percentages are by weight unless otherwise indicated.

EXAMPLE 1

This example illustrates the fabrication of a dielectric layer by coating a microsphere-filled resin on a carrier member. The carrier is a sheet of copper foil, which, in turn, is used to introduce the discrete, microsphere-filled resin layer into a multilayer electrical structure. The multilayer electrical structures described included two layers of the HGS/resin, and an additional polymeric reinforcement sheet, sandwiched between two copper foil carrier sheets.

PPO (poly)2,6-dimethyl-1,4-phenylene ether), having a number average molecular weight of about 20,000, an intrinsic viscosity in chloroform at 25° C. of 0.40 dl/g and a nitrogen content of about 960 ppm (1970 g) was equilibrated in DER 542 brominated epoxy monomer (48.8% bromine content), 328 epoxide equivalent weight, Dow Chemical Company (1637 g), toluene solvent (3821 g), and benzoyl peroxide initiator (79 g) and bisphenol A (79 g) chain terminator at 90° for 90 minutes. Upon cooling, toluene (3495 g), component 270-75 (75% solids in toluene, 1424 g), reaction product of Epon 828 diglycidyl ether of pisphenol A (epoxide equivalent weight 185–192, Shell Chemical Company), and tetrabromobisphenol A (3.5:1.0 molar ratio), reactions initiated at 120° C. using triphenylphosphine catalyst in toluene solvent), Cabosil M-5 calcined fumed silica (300 g, surface area 200 m²/g, Cabot Corp.), zinc octoate (300 g, THERM-CHECK T-705, 80% active zinc octoate in mineral spirits, Ferro Corp.), and A-1100 (30 g, gamma-aminopropyltriethoxysilane, Union Carbide Corp.) were added at room temperature. Hollow glass microspheres (type SI, W. R. Grace), then were homogeneously mixed with the above varnish in a low shear blender to avoid excessive breakage of the microspheres. The concentration of HGS was about 20% by weight of the resin solids. The solids content of the final formulation was 50–53% by weight.

Two sheets of 1 oz. JTC copper foil (Gould, Inc.) were coated with 2–5 mil thick films of the foregoing HGS reinforced PPO/epoxy resin. The coated copper was passed through two heating zones to evaporate the solvent and B-stage with the first zone kept at 120° C. and the second zone at 160° C. with dwell times of approximately 3–4 minutes in each zone. The coated copper foils then were bonded to both sides of either 1 mil Ultem 5001 brand polyetherimide, 2 mil Ultem film (GE Plastics Structured Products Division), 2–3 mil PPO film (0.837 IV, GE Plastics), or a 2 mil TPX 50X44B polymethylpentene film (supplied by Mitsui Petrochemical, Inc.). Dwell times at temperature and pressure indicated in the following table were 5–7 minutes followed by cooling to less than 350° F. under pressure. The following results were recorded.

TABLE 1

Thermoplastic Film Reinforced HGS PPO/Epoxy Laminate

| Core Materials | 1 mil Ultem | 2 mil Ultem | 2 mil PPO | 2 mil TPX |
|---|---|---|---|---|
| Lamination: | | | | |
| Temperature, °C. | 240 | 240 | 230 | 240 |
| Pressure, psi | 550 | 550 | 350 | 350 |
| Etched Thickness (in) | .004" | .004–0.005 | .005–.006 | |
| Film Core Dielectric Constant | 3.15 | 3.15 | 2.56 | 2.1 |
| Adhesion Compatibility | Good | Good | Fair | Poor |
| Resistance to Breakage (Etched Film) | Fair | Good | Fair | — |
| Dielectric Thickness (in)* | 0.0043 | 0.0054 | 0.0059 | — |
| Dielectric Constant* | 3.00 | 3.05 | 2.83 | — |
| Dissipation Factor* | 0.015 | 0.014 | 0.010 | — |

*1 MHz at Room Temperature, IPC-L-112 Test Method

The foregoing results of this lamination indicate that the Ultem and PPO films provided the best adhesion compatibility, whereas the TPX film blistered upon lamination. Examination of the films after etching the copper also indicated that the handleability of the films were substantially upgraded. The final substrate thicknesses were about 4–6 mils. Accordingly, the laminates were quite thin while maintaining low dielectric constants and dissipation factors, and having the brittleness reduced by virtue of the core thermoplastic layer. Adhesion compatibility also was demonstrated in these data.

EXAMPLE 2

This example further illustrates the fabrication of a dielectric layer by coating a microsphere-filled resin on a copper foil carrier sheet.

In this example, two different types of hollow glass microspheres, type SI and FTD-202 (W. R. Grace), were evaluated in the PPO/epoxy resin formulation (see Example 1). The multilayer electrical core structures were prepared with two different core, reinforcement layers, T017550X and T416540X GETEK impregnated glass cloth prepregs (General Electric Company, Coshocton, Ohio), as described below:

TABLE 2

|  | T017550X | T416540X |
|---|---|---|
| Resin Type | GETEK | GETEK |
| Glass Cloth Type | 106 | 1080 |
| wt % Resin | 70–79 | 62–68 |
| % Squeeze Out (IPC-TM-650) | 40–57 | 36–44 |
| Approx. Pressed Thickness | 1.3–2.0 mils | 2.1–3.0 mils |
| U.L. Description | T0## | T4## |

The HGS-filled resin formulation was coated on the backside of 1 oz. JTC copper foil (Gould, Inc.) using a horizontal copper treater with the use of a doctor's blade. The copper treater had two heating zones to evaporate solvents and B-stage the mix, respectively. The temperature of the first zone was maintained at 120° C. and the second zone at 160° C. (dwell times were about 3–4 minutes in each zone).

Thin laminates were produced by pressing two 12"×12" coated copper foils together between two preheated steel pans at 240° C. for 5 minutes at 500 psi pressure. Pressed laminates were cooled to 200° C. under pressure before opening the press. Copper clad thin laminates then were etched to determine the dielectric constant properties, as set forth below.

TABLE 3

| Formulation for Copper Coating (wt %) | 1 | 2 | 3 | 4 | 5 | 6 |
|---|---|---|---|---|---|---|
| PPO/Epoxy Resin | 90 | 90 | 85 | 85 | 80 | 80 |
| Type SI HGS | 10 | — | 15 | — | 20 | — |
| Type FTD HGS | — | 10 | — | 15 | — | 20 |
| Results* |  |  |  |  |  |  |
| DC Without Core Reinforcement | 2.77 | 2.92 | — | — | 2.17 | 2.6.7 |
| DF Without Core Reinforcement | 0.026 | 0.070 | — | — | 0.024 | 0.063 |
| DC With 1 T416540X Core Ply | — | — | 2.64 | 3.25 | 2.57 | 3.10 |
| DF With 1 T416540X Core Ply | — | — | 0.026 | 0.082 | 0.025 | 0.094 |
| DC With 1 T017550X Core Ply | 2.65 | — | 2.49 | — | 2.44 | — |
| DF With 1 T017550X Core Ply | 0.020 | — | 0.020 | — | 0.013 | — |

*DC is dielectric constant tested as received
DF is dissipation factor tested as received The above-tabulated results indicate that thicker glass cloth, T416540X, shows higher a dielectric constant for the same configuration as compared to the thinner cloth. Comparison of the two different types of hollow glass microspheres indicate that the type SI provides lower values of DC and DF compared to type FTD-202.

EXAMPLE 3

This example describes the fabrication of a discrete dielectric layer by coating a microsphere-filled resin on a copper foil carrier sheet. A microsphere-filled resin composition first was prepared by blending hollow glass microspheres (type "SI", W. R. Grace) with a multi-functional epoxy resin (type "45N", Arlon). The concentration of microspheres in the HGS/resin was about 11% by weight of the resin solids. Using a standard roller coating process, a coating of the HGS/resin was applied to the back side of two sheets of 1 oz. JTC copper foil (Gould, Inc.). The coating thickness was controlled at 0.003"–0.005". The coated copper foil then was passed through an oven system at 300° F. for two minutes, in order to evaporate solvents and partially cure (B-stage) the resin coating.

A multilayer electrical core structure then was fabricated by laminating two 12"×12" sheets of the B-stage coated copper foil carrier. The laminates were bonded by processing in a small lamination press under 200 psi pressure at 365° F. for approximately 1.5 hours. The thin multilayer electrical structures produced featured a total HGS/resin thickness of 0.006"–0.010" between two sheets of copper foil (no additional core reinforcement).

EXAMPLE 4

This example demonstrates the fabrication of a complete printed wiring board multilayer electrical laminate structure using copper foil sheets, microsphere-filled resin layers, standard woven glass layers, and standard resin-impregnated woven glass prepregs.

Multilayer electrical core structures first were fabricated (as described in Example 2) having two layers of HGS/resin and an additional woven glass (Type 106) reinforcement layer sandwiched between two copper foil layers (to produce a core structure as illustrated in FIG. 5).

The prepared core structures then were processed through a chemical pre-clean process to remove unwanted contaminates from the copper surface (e.g., oxides and other residues) and to promote favorable image adhesion to the copper surface. Following the pre-cleaning process, the core structures were coated with a photosensitive resist dry film, which, in turn, was exposed using selected PWB artwork. After exposure, the exposed inner layer of the core was processed through a film developer to produce the selected PWB image on the inner surface of the core. The cores then were processed through an etch and strip process to remove the circuit pattern which was created during the imaging process. The etching process serves to remove the portions of the copper sheet that were left uncovered during the imaging process. The strip process removes the remaining photosensitive resist that had been applied to the inner surface of the cores.

Following inspection, the cores were processed through an oxide treatment line to promote adhesion between the circuitry pattern of the core inner layer and a B-staged, epoxy resin-impregnated woven glass prepreg. After the oxide treatment, the cores are baked in a vertical rack, using a bake oven at a temperature of 250° F. for about 1 hour. This bake cycle serves to drive off unwanted moisture from the cores before proceeding to the PWB lay-up process.

The lay-up process was initiated immediately after the cores cooled. In the lay-up process, the cores and B-staged epoxy resin-impregnated woven glass prepreg sheets were assembled in the proper sequence to form a PWB structure featuring an inner core structure, with two sheets of woven glass prepreg on either side thereof, sandwiched between two additional core structures (to form a PWB multilayer electrical structure similar to that illustrated in FIG. 6). The lay-up process employed a lamination tooling fixture to ensure inner layer registration and to serve as a handling fixture for lamination.

Once the desired sequence of layers were set in the lay-up process, the lamination fixtures were loaded in a vacuum lamination press. Vacuum was pumped down for 30 minutes and then the fixtures were internally transferred to a hot press. The press cycle started with the fixtures being held at a 50 psi low pressure kiss cycle for 14 minutes at a temperature of 260° F. After this part of the cycle, the press ramps up to 200 psi and a temperature of 390° F. for a cure cycle of 60 minutes. The fixtures finally were cooled in the cooling section of the lamination press for an additional 30 minutes. The fixtures then were removed from the lamination press and broken down. The resulting PWB multilayer electrical panels were processed through a deflashing process to remove resin that was pressed out of the edges during the lamination process.

Certain modifications may be made in details of the above description of the invention without departing from the spirit and scope of the invention defined in the appended claims. Accordingly, it is intended that all matter contained in the above description or shown in the accompanying figures be interpreted as illustrative and not limiting in nature.

What is claimed is:

1. A method of fabricating a multilayer electrical structure, comprising:

introducing a first microsphere-filled resin layer and a first removable carrier member supporting the first microsphere-filled resin layer to the multilayer structure;

introducing a second microsphere-filled resin layer, supported by a second removable carrier member, to the multilayer structure; and laminating the first and the second microsphere-filled resin layers and the multilayer structure to form a permanently bonded multilayer laminate in which the first and the second microsphere-filled resin layers provide a microsphere-containing dielectric layer;

wherein the second microsphere-filled resin layer is introduced adjacent to the first microsphere-filled resin layer after the first removable carrier member is removed from the first microsphere-filled resin layer.

2. The method of claim 1, further comprising:

peeling away the first removable carrier member from the first microsphere-filled resin layer after introducing the first microsphere-filled resin layer and the first removable carrier member to the multilayer structure and prior to laminating the multilayer structure and the first and the second microsphere-filled resin layers.

3. The method of claim 1, further comprising:

etching away the first removable carrier member from the first microsphere-filled resin layer after introducing the first microsphere-filled resin layer and the first removable carrier member to the multilayer structure and prior to laminating the multilayer structure and the first and the second microsphere-filled resin layers.

4. The method of claim 1, further comprising:

applying the first microsphere-filled resin layer to the first removable carrier member; and partially-curing the first microsphere-filled resin layer prior to introduction to the multilayer structure and lamination of the multilayer structure and the first and the second microsphere-filled resin layers.

5. The method of claim 1, wherein the first microsphere-filled resin layer is discrete and partially cured.

6. The method of claim 1, wherein the second microsphere-filled resin layer is discrete and partially cured.

7. The method of claim 1, further comprising:

removing the second removable carrier member from the second microsphere-filled resin layer after introducing the second microsphere-filled resin layer and the second removable carrier member to the multilayer structure and prior to laminating the multilayer structure and the first and the second microsphere-filled resin layers.

8. A method of fabricating a multilayer electrical structure, comprising:

introducing a first microsphere-filled resin layer and a first removable carrier member supporting the first microsphere-filled resin layer to the multilayer structure;

removing the first removable carrier member from the first microsphere-filled resin layer;

introducing a second microsphere-filled resin layer, supported by a second removable carrier member, to the multilayer structure; and laminating the first and the second microsphere-filled resin layers and the multilayer structure to form a permanently bonded multilayer laminate in which the first and the second microsphere-filled resin layers provide a microsphere-containing dielectric layer.

9. The method of claim 8, wherein the first microsphere-filled resin layer is discrete and partially cured.

10. The method of claim 8, wherein the second microsphere-filled resin layer is discrete and partially cured.

11. The method of claim 8, further comprising:

removing the second removable carrier member from the second microsphere-filled resin layer after introducing the second microsphere-filled resin layer and the second removable carrier member to the multilayer structure and prior to laminating the multilayer structure and the first and the second microsphere-filled resin layers.

12. A method of fabricating a multilayer electrical structure, comprising introducing a first discrete, partially-cured microsphere-filled resin layer and a first removable carrier member supporting the first microsphere-filled resin layer to the multilayer structure;

introducing a second discrete, partially-cured microsphere-filled resin layer, supported by a second removable carrier member, to the multilayer structure, the second microsphere-filled resin layer being introduced adjacent to the first microsphere-filled resin layer;

laminating the first and second partially-cured microsphere-filled resin layers and the multilayer structure to form a permanently bonded multilayer laminate in which the microsphere-filled resin layers provide a microsphere-containing dielectric layer; and wherein the first microsphere-filled resin layer is introduced adjacent to the multilayer structure and the second microsphere-filled resin layer is introduced adjacent to the first microsphere-filled resin layer after the first removable carrier member is removed from the first microsphere-filled resin layer.

* * * * *